(12) United States Patent
Kasai

(10) Patent No.: US 6,352,891 B1
(45) Date of Patent: Mar. 5, 2002

(54) METHOD OF MANUFACTURING SEMICONDUCTOR DEVICE IN WHICH HOT CARRIER RESISTANCE CAN BE IMPROVED AND SILICIDE LAYER CAN BE FORMED WITH HIGH RELIABILITY

(75) Inventor: Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/466,722

(22) Filed: Dec. 17, 1999

Related U.S. Application Data

(62) Division of application No. 09/305,564, filed on May 5, 1999.

(30) Foreign Application Priority Data

May 27, 1998 (JP) ............................................ 10-146345

(51) Int. Cl.$^7$ ......................................... H01L 21/8242
(52) U.S. Cl. ...................................... 438/241; 438/258
(58) Field of Search ................................. 438/258, 241

(56) References Cited

U.S. PATENT DOCUMENTS 5,733,809 A * 3/1998 Dennison et al. ........... 438/253

FOREIGN PATENT DOCUMENTS

| JP | 3-94464     | 4/1991  |
| JP | 03-205865   | 9/1991  |
| JP | 04-262573   | 9/1992  |
| JP | H05-291530  | 11/1993 |
| JP | 8-236716    | 9/1996  |
| JP | 09-116113   | 5/1997  |
| JP | 10-12847    | 1/1998  |
| JP | H10-012847  | 1/1998  |
| JP | 10-41480    | 2/1998  |
| JP | H10-242420  | 9/1998  |

* cited by examiner

*Primary Examiner*—John F. Niebling
*Assistant Examiner*—Jennifer M. Kennedy
(74) *Attorney, Agent, or Firm*—Scully, Scott, Murphy & Presser

(57) ABSTRACT

The method of manufacturing a semiconductor device having a first and second semiconductor element formation regions. The second gate electrode is of a second semiconductor element formation region while the first semiconductor element formation region is masked. The second source/drain region is a of the second semiconductor element and is formed in the second semiconductor element formation region while the first semiconductor element formation region is masked. The second sidewall insulating film are formed on side portions of the second gate electrode while the first semiconductor element formation regions is masked. The first gate electrode is of a first semiconductor element and is formed in the first semiconductor element formation region while the second semiconductor element formation region is masked. The first source/drain region is of the first semiconductor element and is formed in the first semiconductor element formation region while the second semiconductor element formation region is masked. The first sidewall insulating films is formed on side portions of the first gate electrode.

7 Claims, 23 Drawing Sheets

← PERIPHERAL CIRCUIT REGION | MEMORY CELL REGION →

METHOD OF MANUFACTURING SEMICONDUCTOR DEVICE IN WHICH HOT CARRIER RESISTANCE CAN BE IMPROVED AND SILICIDE LAYER CAN BE FORMED WITH HIGH RELIABILITY

CROSS REFERENCE TO RELATED APPLICATION

The present application is a divisional application of application Ser. No. 09/305,564 filed on May 5, 1999.

BACKGROUND OF THE INVENTION

1. Field of the Invention

The present invention relates to a method of manufacturing a semiconductor device in which hot carrier resistance can be improved and silicide layer can be formed with high reliability.

2. Description of the Related Art

In recent years, a merged DRAM (Dynamic Random Access Memory)—logic LSI has been used in many cases. In the merged DRAM-logic LSI, a logic integrated circuit and a DRAM are simultaneously formed on a single chip, to make a performance of a ULSI (Ultra Large Scale Integration) higher and make a function thereof higher. This merged DRAM-logic LSI is expected to include a large capacity of DRAM without drop of the performance of logic parts. It is also expected that the merged DRASM-logic LSI can be manufactured at a low cost.

For this reason, the structure in which silicide layer is formed on the surface of high impurity concentration diffusion layer serving as a source/drain of a MOSFET is used to achieve the high performance, in the merged DRAM-logic LSI. Silicon nitride film is often used as a spacer for covering a side portion of a gate electrode to form this silicide layer in self-alignment, On one hand, in a general purpose DRAM, the silicide layer is not formed on the surface of the diffusion layer, in view of a cost. On the contrary, if the DRAM is merged with the logic LSI, the silicide layer can be formed on the surface of the diffusion layer of the MOSFET (Metal Oxide Silicon Field Effect Transistor) of the DRAM without increasing the cost.

However, the diffusion layer used as the source/drain of the MOSFET in a DRAM memory cell is the diffusion layer having a low impurity concentration of which a junction depth is shallow. Here, the reason why the source/drain of the MOSFET in the DRAM memory cell is formed as the diffusion layer having the low impurity concentration of which the junction depth is shallow is to suppress a short channel effect, suppress a junction leak current and improve a hot carrier resistance. Moreover, silicon oxide film is used as an insulating film spacer formed on the side portion of the gate electrode of the MOSFET.

However, the following first to third problems are incurred if the silicide layer is formed on the surface of the diffusion layer having the low impurity concentration of which the junction depth is shallow as the source/drain of the MOSFET in the DRAM memory cell.

Firstly, a contact resistance is high between the silicide layer and the diffusion layer having the low impurity concentration. Although the silicide layer is formed on the region of the source/drain, there may be a case in which an external resistance in the region of the source/drain is high, conversely to the original object.

Secondly, the shallow depth of the diffusion layer of the source/drain causes the junction leak current to be increased.

Thirdly, the use of the silicon nitride film as the insulating film spacer on the side portion of the gate electrode causes the hot carrier resistance to be deteriorated.

A method of selectively forming a silicide layer on a diffusion layer in a semiconductor device is disclosed in Japanese Laid Open Patent Application (JP-A-Heisei 3-205865), as a method of avoiding a part of the above-mentioned problems. The gazette discloses a method that a silicide layer is formed on a surface of the diffusion layer in a first MOSFET of a semiconductor device and a silicide layer is not formed on a surface of the diffusion layer in a second MOSFET of the semiconductor device.

The conventional example noted in the gazette will be described below with reference to FIGS. 1 to 5.

At first, an N-type well 102, a field oxide film 103, a gate oxide film 104, a gate electrode 105 formed of polysilicon and the like, a P-type low impurity concentration region 107 and side walls 106 are formed on the surface of a semiconductor substrate 101, in FIG. 1.

Next, as shown in FIG. 2, a silicon nitride film 112 serving as a first insulating film is grown on an entire portion of the surface. The silicon nitride film 112 has a function of a mask to divide the source/drain between the region on which a silicide layer is formed and the region on which a silicide layer is not formed. The silicon nitride film 112 has a thickness of, for example, about 30 nm. Then, a silicon oxide film 113 serving as a second insulating film is deposited on the entire portion of the surface in a thickness of about 100 nm.

Next, as shown in FIG. 3, photolithography technique is used to etch the silicon oxide film 113 corresponding to the region on which the silicide layer is formed. After that, the silicon nitride film 112 corresponding to the same region is etched.

Next, as shown in FIG. 4, a metal having a high melting point, for example, Ti is sputtered on the entire surface in about 80 nm. Then, annealing is performed thereon so that Ti and Si react to together in the region, in which the silicon oxide film 113 is removed, to accordingly form a Ti silicide 109. The Ti silicide 109 has a thickness of, for example, about 100 nm.

Next, as shown in FIG. 5, the Ti that is not constitutes the Ti silicide 109 and is present on the region where the silicon oxide film 113 is not removed, is removed by the etching. Then, a silicon oxide film 114 with a thickness of about 25 nm is formed on the entire surface. After that, a P-type high concentration impurity region 111a is formed by, for example, ion implantation of boron.

However, in the conventional example, it is necessary to increase a lithography process to form the region where the Ti silicide 109 is formed and the region where it is not formed. Thus, the conventional example has the defect of increasing the manufacturing process.

Moreover, in the conventional example, the same material is used in the region where the silicide layer is formed and the region where it is not formed, for the side wall of the gate electrode of the MOSFET. Thus, the simple application of the conventional example to the merged DRAM-logic device results in the problem that the hot carrier resistance of the MOSFET is deteriorated.

To change the material of the side wall in the region where the Ti silicide, 109, is formed, the once-formed side wall 106 is removed by using the lithography process. After that, a next side wall 106 can be formed newly. However, in order to carry out this treatment, it is necessary to increase one or more lithography processes. Thus, this has the defect of increasing the manufacturing process.

Japanese Laid Open Patent Application (JP-A-Heisei 9-116113) discloses a method of manufacturing a semiconductor device, as described below. A memory cell is formed after a circuit field effect transistor is covered with insulating film. After the formation of the memory cell, the surface of diffusion layer of the circuit field effect transistor is exposed to then form the covered conductive layer on the exposed surface of the diffusion layer.

Japanese Laid Open Patent Application (JP-A-Heisei 4-262573) discloses a method of manufacturing a semiconductor device, as described below. A first side wall protection film that is common to a memory cell array formation region and a peripheral circuit formation region is formed when forming a transistor having LDD structure. After that, anisotropy etching is further performed on only the first side wall protection film in the peripheral circuit formation region to thereby form a second side wall protection film having a width narrower than that of the first side wall protection film. Then, LDD regions having different widths are formed in the respective memory cell array region and peripheral circuit region, with these first and second side wall protection films as respective masks.

Japanese Laid Open Patent Application (JP-A-Heisei 10-41480) discloses a method of manufacturing a semiconductor memory device, as described below. A cell array region, a core region and a peripheral circuit region are respectively formed in a semiconductor memory device having transistor structure. A source/drain of a transistor in the cell array region is provided with low concentration impurity regions. A source/drain of a transistor in the core region is provided with a high concentration impurity region 112 and a low concentration impurity region 108 that are formed with the same dopant. A source/drain of a transistor in the peripheral circuit region is provided with a high concentration impurity region and a low concentration impurity region that are formed with dopants different from each other. Especially, the dopant of the low concentration impurity region of the transistor in the core region is lower in diffusion degree than the dopant of the low concentration impurity region of the transistor in the peripheral circuit region.

The present invention is accomplished in view of the above-mentioned background. Therefore, the present invention provides a semiconductor device in which the hot carrier resistance is not deteriorated without the increase of the manufacturing process, and a method of manufacturing it.

Moreover, the present invention provides a semiconductor device in which the silicide layer can be formed with high reliability without the deterioration of the hot carrier resistance and the increase of the manufacturing process, and a method of manufacturing it.

SUMMARY OF THE INVENTION

The present invention has been made to solve the above-described problems of the conventional semiconductor device and method of manufacturing it. An object of the present invention is to provide a semiconductor device and method of manufacturing it to provide a semiconductor device and method of manufacturing it in which hot carrier resistance can be improved. Another object is to provide a semiconductor device and method of manufacturing it in which silicide layer can be formed with high reliability.

In order to achieve an aspect of the present invention, a method of manufacturing a semiconductor device includes (a) providing a semiconductor substrate having first and second semiconductor element formation regions, (b) forming a second gate electrode of a second semiconductor element in the second semiconductor element formation region in a state that the first semiconductor element formation region is masked, (c) forming a second source/drain region of the second semiconductor element in the second semiconductor element formation region in the state that the first semiconductor element formation region is masked, (d) forming second side wall insulating films on side portions of the second gate electrode in the state that the first semiconductor element formation region is masked, (e) forming a first gate electrode of a first semiconductor element in the first semiconductor element formation region in a state that the second semiconductor element formation region is masked, (f) forming a first source/drain region of the first semiconductor element in the first semiconductor element formation region in the state that the second semiconductor element formation region is masked, and (g) forming first side wall insulating films on side portions of the first gate electrode.

In this case, the steps (e), (f) and (g) are performed after the steps (b), (c) and (d) are performed.

Also in this case, the steps (b), (c) and (d) are performed after the steps (e), (f) and (g) are performed.

Further the method of manufacturing a semiconductor device further includes setting an impurity concentration of the first source/drain region to a predetermined impurity concentration.

In order to achieve another aspect of the present invention, the method of manufacturing a semiconductor device further includes forming a silicide layer on the first source/drain region set to the predetermined impurity concentration.

In this case, the first semiconductor element is a MOSFET of a logic integrated circuit, and the second semiconductor element, is a MOSFET of a memory cell of a DRAM.

Also in this case, the forming the silicide layer includes forming the silicide layer in self-alignment with the first side wall insulating films.

Further in this case, the first and second side wall insulating films are formed of materials different from each other.

In this case, the second side wall insulating films are formed of silicon oxide.

Also in this case, the first side wall insulating films are formed of silicon nitride.

Further in this case, masks for masking the first and second semiconductor element formation regions are different from each other.

In this case, the forming a first side wall insulating films includes forming the first side wall insulating films in the state that the second semiconductor element formation region is masked.

Also in this case, the first source/drain region set to the predetermined impurity concentration is higher in impurity concentration than the second source/drain region.

Further in this case, the second source/drain region is connected to one of an electrode of a capacitor of a memory cell of a DRAM and a bit line of the memory cell of the DRAM.

In this case, the second source/drain region set to the predetermined impurity concentration is connected to a bit line of a memory cell of a DRAM.

Also in this case, a plurality of the second gate electrodes are formed in the second semiconductor element formation region in the step (b), and the step (b) includes masking the first semiconductor element formation region and an element separation region provided between the first and second semiconductor element formation regions.

Further in this case, the method of manufacturing a semiconductor device further includes forming a dummy gate electrode for covering the second source/drain region when an impurity concentration of the first source/drain region to the predetermined impurity concentration is set.

In this case, the forming a dummy gate electrode includes forming a dummy gate electrode such that a third side wall insulating film is formed on a side portion on a side of the first semiconductor element formation region of the dummy gate electrode and a fourth side wall insulating film is formed on a side portion on a side of the second semiconductor element formation region of the dummy gate electrode.

Also in this case, the forming a dummy gate electrode includes forming a dummy gate electrode by using a first mask to mask the first semiconductor element formation region when the second gate electrode is formed and a second mask to mask the second semiconductor element formation region when the first gate electrode is formed.

In order to achieve still another aspect of the present invention, a semiconductor device includes a semiconductor substrate in which first and second semiconductor element formation regions electrically separated from each other are formed, a first MOS transistor formed in the first semiconductor element formation region, a first insulating film spacer formed on a side portion of a gate electrode of the first MOS transistor, a second MOS transistor formed in the second semiconductor element formation region, and a second insulating film spacer which is formed on a side portion of a gate electrode of the second MOS transistor and is formed of material different from that of the first insulating film spacer.

In this case, the first insulating film spacer has a function of improving a hot carrier resistance of the first MOS transistor, and the second insulating film spacer has functions of protecting a gate electrode of the second MOS transistor and helping to form a silicide layer when the silicide layer in self-alignment in a source/drain region of the second MOS transistor is formed.

In order to achieve yet still another aspect of the present invention, the semiconductor device further includes a dummy gate electrode which is formed between the first and second semiconductor element formation regions and has a gate electrode structure of a MOS transistor, a third insulating film spacer formed on a side portion on a side of the first semiconductor element formation region of the dummy gate electrode, and a fourth insulating film spacer formed on a side portion on a side of the second semiconductor element formation region of the dummy gate electrode.

The present invention provides a method of manufacturing a semiconductor device, in which the material (for example, silicon oxide film) of an insulating film spacer formed on a side portion of a transistor of a DRAM memory cell and the material (for example, silicon nitride film) of an insulating film spacer formed on a side portion of a transistor other than the memory cell are different from each other, when forming a semiconductor integrated circuit in which a DRAM and a logic circuit are merged on a single chip.

As shown in FIGS. 7 to 13, respective gate electrodes of MOSFETs in a memory cell and a peripheral circuit region are sequentially formed with different masks. Accordingly, the materials of the insulating film spacers formed on the side portions of the gate electrodes can be made different from each other without the increase of the total number of masks.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail. Embodiments of the present invention will be described below with reference to the attached drawings.

Figure 1:
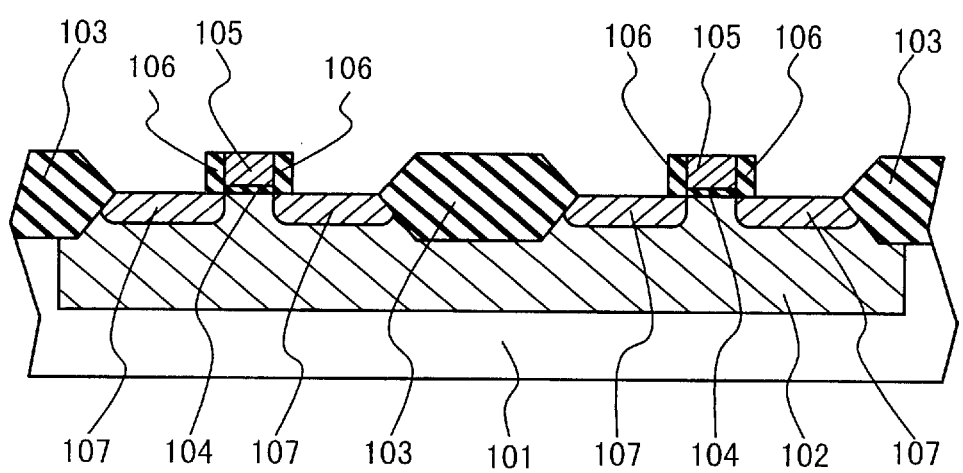
FIG. 1 is a section view showing a process of manufacturing a conventional semiconductor device.
Figure 2:
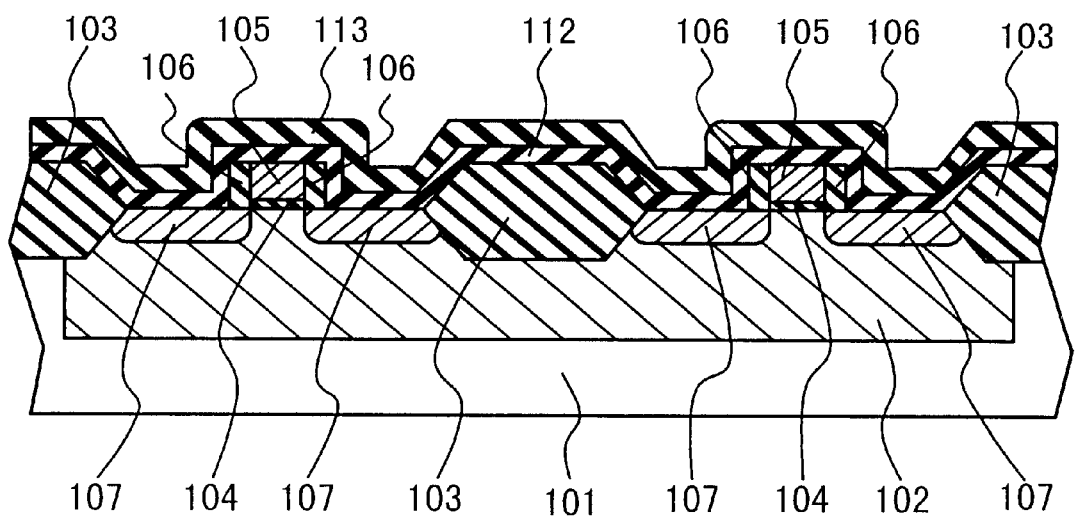
FIG. 2 is a section view showing another process of manufacturing a conventional semiconductor device.
Figure 3:
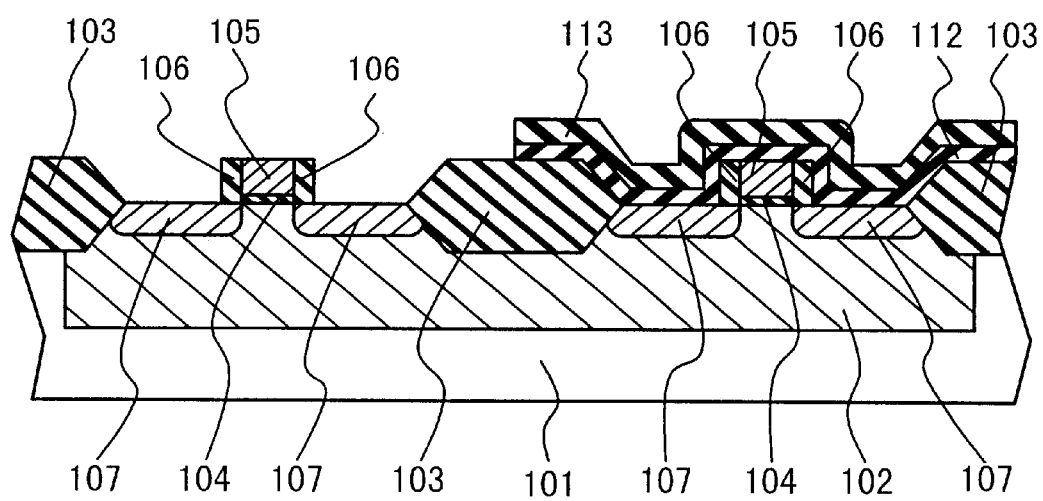
FIG. 3 is a section view showing still another process of manufacturing a conventional semiconductor device.
Figure 4:
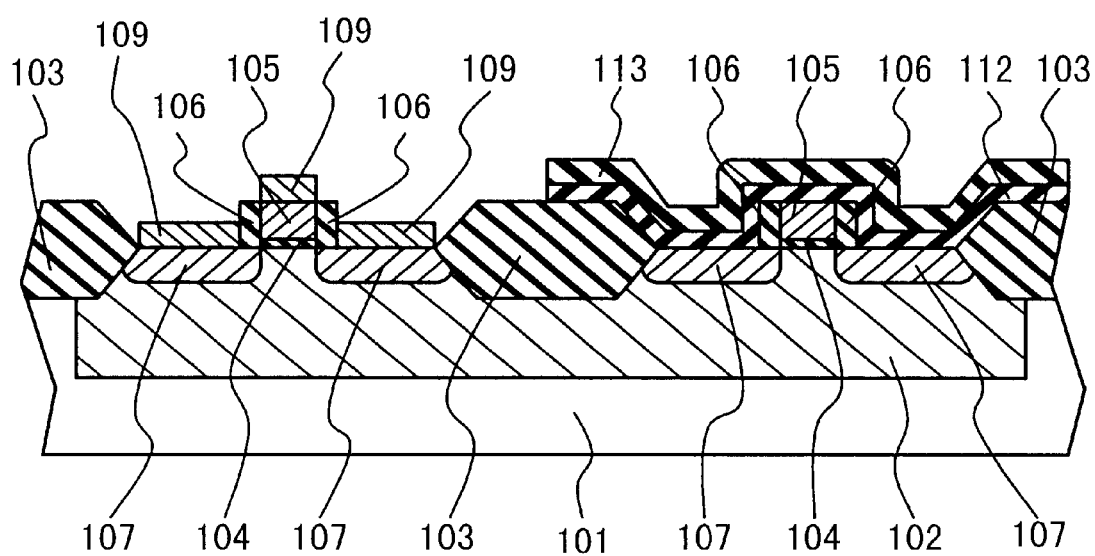
FIG. 4 is a section view showing still another process of manufacturing a conventional semiconductor device.
Figure 5:
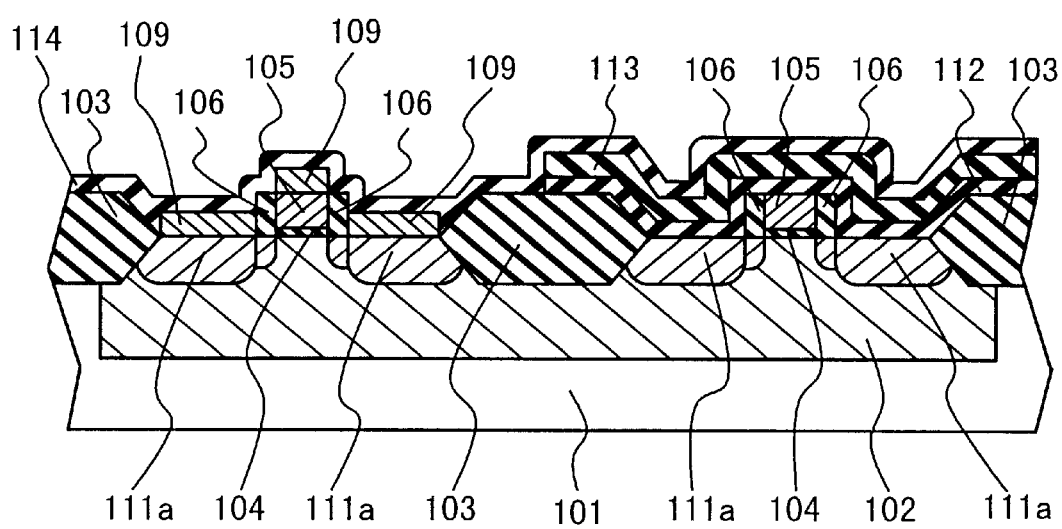
FIG. 5 is a section view showing still another process of manufacturing a conventional semiconductor device.
Figure 6:
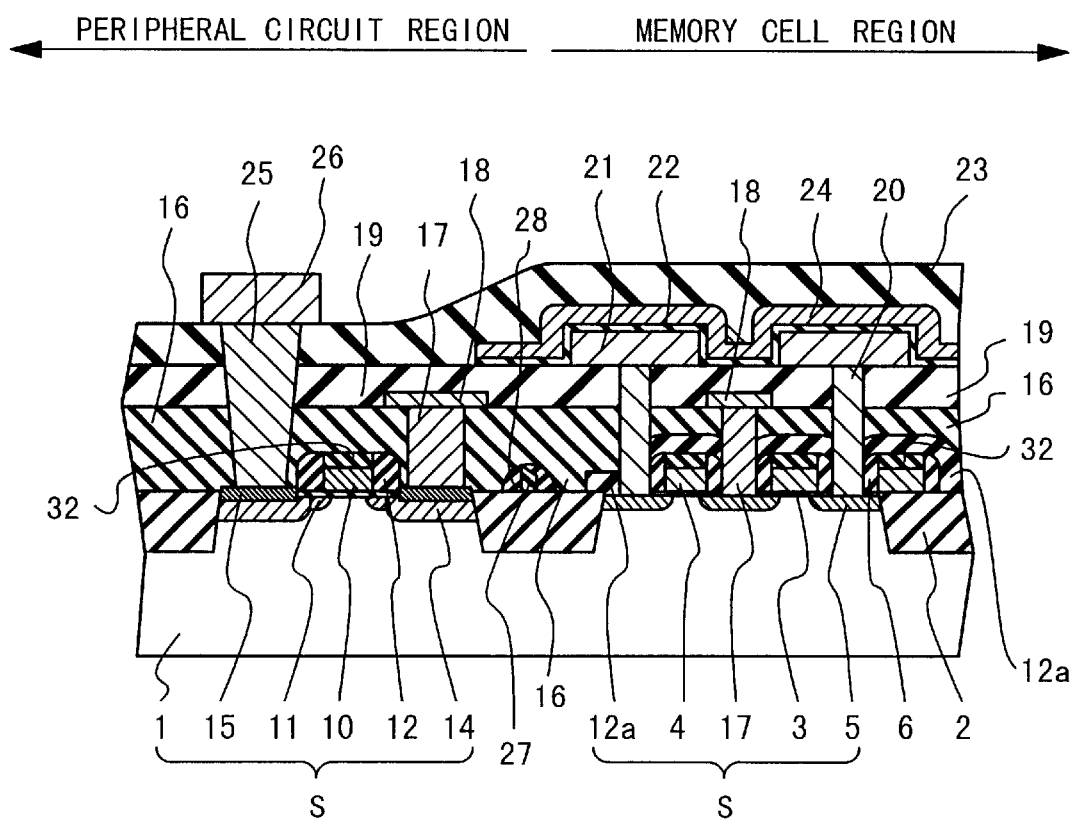
FIG. 6 is a section view showing a semiconductor device according to a first embodiment in the present invention.

FIG. 6 is a section view showing the structure of a semiconductor device according to a first embodiment in the present invention. As shown in FIG. 6, in a surface region of, for example, a P-type silicon substrate 1, an element region S is defined by an element separation insulating film 2 formed of silicon oxide. The element region S includes a memory cell region and a peripheral circuit region.

A gate oxide film 3 is formed on the surface of the P-type silicon substrate 1 in the element region S. The gate oxide film 3 is formed of a silicon oxide with a film thickness of 8 nm. A gate electrode 4 of a memory cell transistor is formed on a surface of the gate oxide film 3 in the memory cell region. The gate electrode 4 is a laminated film of an N-type polysilicon film with a film thickness of 100 nm and a tungsten silicide film with a film thickness of 150 nm.

A peripheral gate electrode 10 is formed on a surface of the gate oxide film 3 in the peripheral circuit region. The peripheral gate electrode 10 is a laminated film of an N-type polysilicon film with a film thickness of 100 nm and a tungsten silicide film with a film thickness of 150 nm. A first silicon nitride film 32 is formed on the surfaces of the cell gate electrode 4 and the peripheral gate electrode 10. A cell gate side silicon oxide film 6 is formed on the side portion of the cell gate electrode 4.

A peripheral gate side silicon nitride film 12 is formed on the side portion of the peripheral gate electrode 10.

In the memory cell region, a low impurity concentration cell N-type diffusion layer 5 is formed on the surface of the P-type semiconductor substrate 1, on which the cell gate electrode 4 is not formed. The low impurity concentration cell N-type diffusion layer 5 serves as a source/drain of a cell MOSFET in the memory cell region.

In the peripheral circuit region, a low impurity concentration periphery N-type diffusion layer 11 and a high impurity concentration periphery N-type diffusion layer 14 are formed on the surface of the P-type semiconductor substrate 1, on which the peripheral gate electrode 10 is not formed. The low impurity concentration periphery N-type diffusion layer 11 and the high impurity concentration periphery N-type diffusion layer 14 serves as a source/drain of a peripheral MOSFET in the peripheral circuit region. A titanium silicide layer 15 is formed on the surface of the high impurity concentration periphery N-type diffusion layer 14.

The titanium silicide layer 15 with a film thickness of 50 nm is formed on the surface of the high impurity concentration periphery N-type diffusion layer 14. A first interlayer dielectric film 16 formed of a silicon oxide with a film thickness of 300 nm is deposited on the surface of the P-type semiconductor substrate 1. A bit line 18 is formed on the surface of the first interlayer dielectric film 16. The bit line 18 is formed of a tungsten silicide with a film thickness of 150 nm. A first contact plug 17 is formed in the first interlayer dielectric film 16. The first contact plug 17 connects the low impurity concentration cell N-type diffusion layer 5 or the titanium ium silicide layer 15 to the bit line 18. The first contact plug 17 is formed of N-type polysilicon.

A second interlayer dielectric film 19 formed of a silicon oxide with a film thereof thickness of 200 nm is deposited on the surface of the first interlayer dielectric film 16. A low portion electrode 21 of a capacitor is formed on the surface of the second interlayer dielectric film 19. The low portion electrode 21 of the capacitor is formed of an N-type polysilicon with film thickness of 500 nm. A second contact plug 20 formed of N-type polysilicon is formed in the second interlayer dielectric film 19 and the first interlayer dielectric film 16. The second contact plug 20 connects the low impurity concentration cell N-type diffusion layer 5 to the low portion electrode 21 of the capacitor.

A insulating film 22 of the capacitor is provided on the surface of the low portion electrode 21 of the capacitor, so as to cover it. A upper portion electrode 24 of the capacitor is formed on the insulating film 22 of the capacitor. A third interlayer dielectric film 23 is deposited on the surface of the second interlayer dielectric film 19. The third interlayer dielectric film 23 is formed of a silicon oxide with a film thickness of 200 nm. A metal wiring 26 is formed on the surface of the third interlayer dielectric film 23. The metal wiring 26 is formed of an aluminum alloy with a film thickness of 300 nm. A third contact plug 25 is formed in the third interlayer dielectric film 23, the second interlayer dielectric film 19 and the first interlayer dielectric film 16. The third contact plug 25 is formed of tungsten for connecting the titanium ium silicide layer 15 to the metal wiring 26.

In addition, a symbol 27 denotes the remainder of the silicon oxide film, and a symbol 28 denotes the silicon nitride film.

A process of manufacturing a semiconductor device shown in FIG. 6 will be described below with reference to FIGS. 7 to 14. FIGS. 7 to 14 are views showing the section views of the semiconductor device in the first embodiment, in the order of the manufacturing method.

Figure 7:
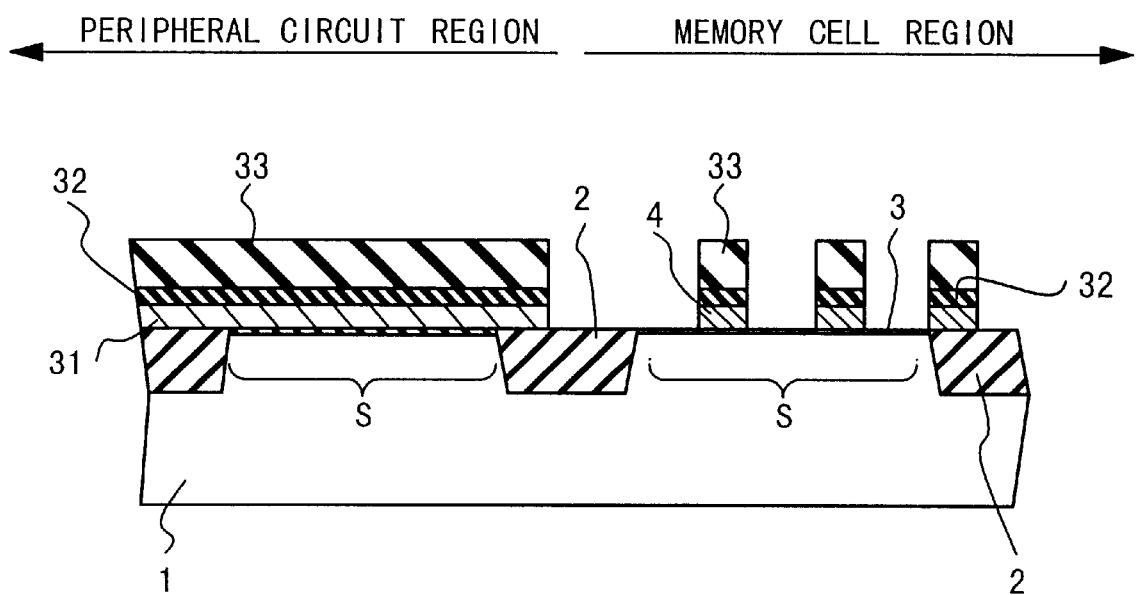
FIG. 7 is a section view showing a process of manufacturing the semiconductor device shown in FIG. 6.

In FIG. 7, the element separation insulating film 2 is formed on the surface of the P-type silicon substrate 1. The element region S is defined on the surface of the P-type silicon substrate 1, by the element separation insulating film 2. The element separation insulating film 2 has the trench isolation structure in which the silicon oxide film is buried in the groove formed on the surface of the P-type silicon substrate 1.

The gate oxide film 3 is formed on the surface of the P-type silicon substrate 1 in the element region S. The gate oxide film 3 is formed of a silicon oxide that has a film thickness of 8 nm and is formed with thermal oxidation. Next, a stacked film composed of a tungsten polycide film 31 and a first silicon nitride film 32 is formed on the gate oxide film 3. The tungsten polycide film 31 includes an N-type polysilicon film and a tungsten silicide film. The N-type polysilicon film has a film thickness of 100 nm and is deposited with the CVD (Chemically Vapor Development) method on the entire surface of the P-type silicon substrate 1. The tungsten silicide film has a film thickness of 150 nm and is deposited with the sputtering on the entire surface of the P-type silicon substrate 1. The first silicon nitride film 32 is deposited with the CVD method, and it has a film thickness of 200 nm.

Then, the cell gate electrode 4 is formed by etching the first silicon nitride film 32 and the tungsten polycide film 31, with a resist 33 formed by the lithography technique as a mask. At this time, the respective stacked films in the peripheral circuit region are left since the peripheral circuit region is entirely covered with the resist 33.

Figure 8:
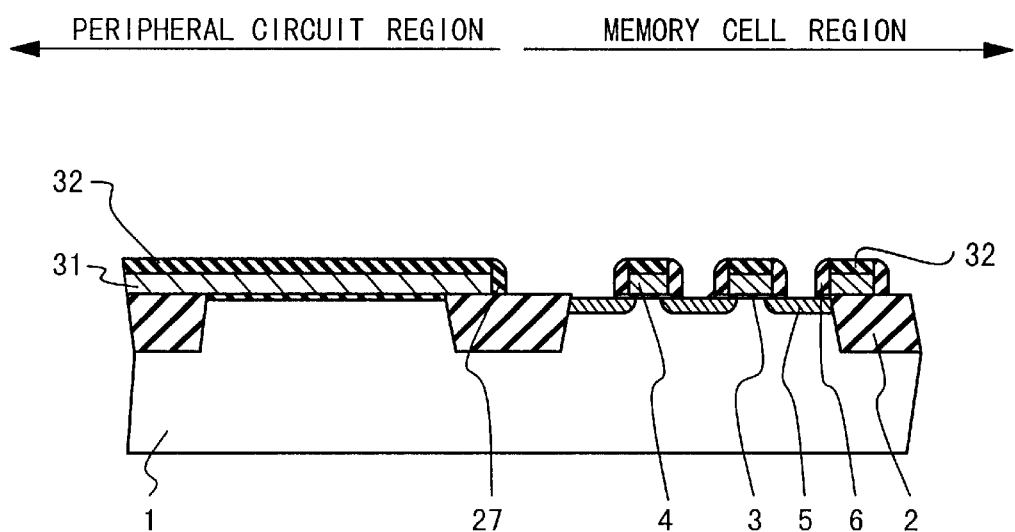
FIG. 8 is a section view showing another process of manufacturing the semiconductor device shown in FIG. 6.

Next, in FIG. 8, after the removal of the resist 33, the ion implantation is carried out with the stacked film of the first silicon nitride film 32 and the tungsten polycide film 31 as the mask, in the peripheral circuit region and the memory cell region. In this ion implantation, the ion is implanted at an implantation dose of $2E13 cm^{-2}$ in an implantation energy of 15 keV. Accordingly, the low impurity concentration cell N-type diffusion layer 5 is formed in the memory cell region.

Then, a silicon oxide film with a film thickness of 50 nm is deposited, with the CVD method. The deposited silicon oxide film is etched back to thereby form the cell gate side silicon oxide film 6 only on the side portion of the gate electrode 4 of the memory cell transistor.

Figure 9:
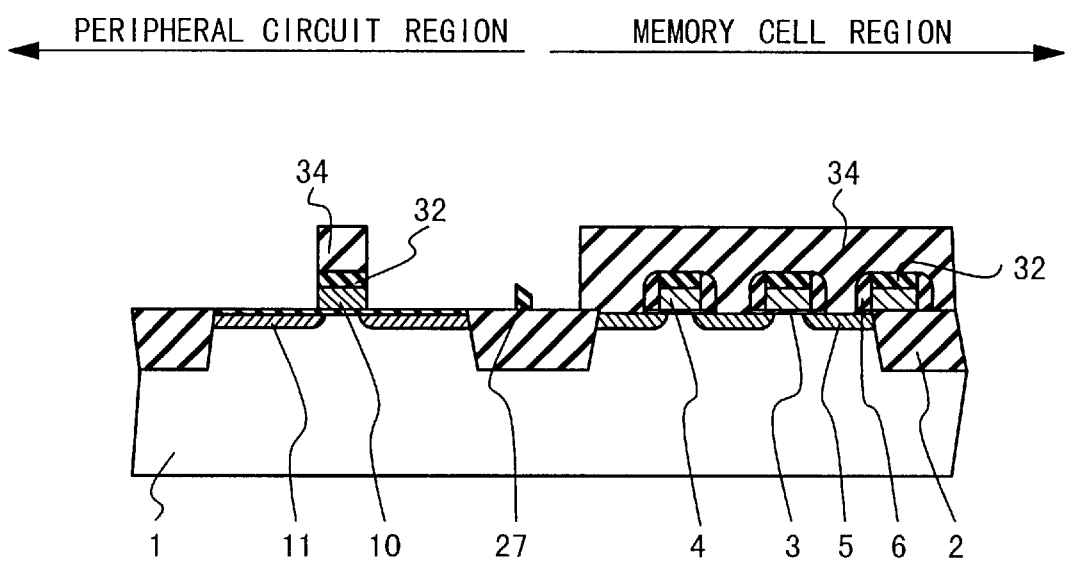
FIG. 9 is a section view showing still another process of manufacturing the semiconductor device shown in FIG. 6.

Next, in FIG. 9, the gate electrode 10 of the transistor in the peripheral circuit region is formed by etching the first silicon nitride film 32 and the tungsten polycide film 31, with a resist 34 formed by the lithography technique as a mask. At this time, the resist 34 is formed on the entire region of the memory cell region.

At this time, there may be a case in which a remainder 27 of the silicon oxide film is generated in a boundary between the memory cell region and the peripheral circuit region. Next, the ion implantation is carried out with the resist 34 as a mask. In this ion implantation, an arsenic ion is implanted at an implantation dose of $1E13cm^{-2}$ in an implantation energy of 30 keV. Accordingly, the low impurity concentration periphery N-type diffusion layer 11 is formed in the peripheral circuit region.

Figure 10:
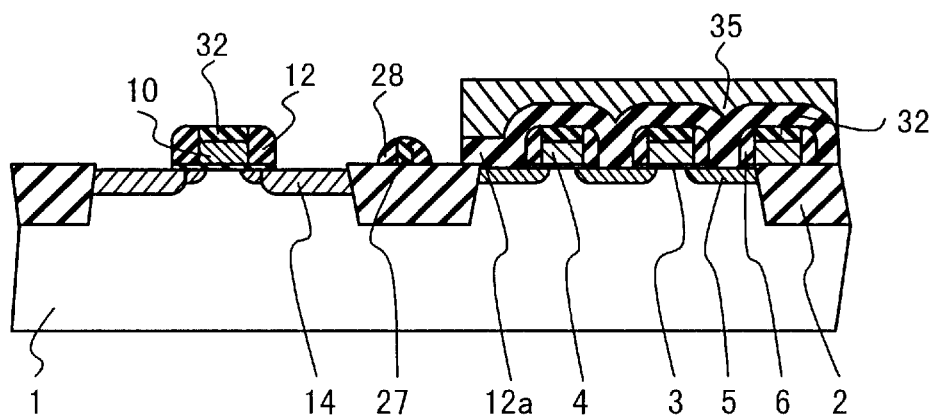
FIG. 10 is a section view showing still another process of manufacturing the semiconductor device shown in FIG. 6.

Next, in FIG. 10, after the removal of the resist 34, a second silicon nitride film 12a with a film thickness of 150 nm is deposited with the CVD method, in the peripheral circuit region and the memory cell region. Then, the peripheral gate side silicon nitride film 12 is formed on the side portion of the peripheral gate electrode 10 by etching back the second silicon nitride film 12a, with a resist 35 formed by the lithography technique as a mask. The resist 35 is formed on the entire region of the memory cell region.

By using the ion implantation, the arsenic is implanted by $3E15cm^{-2}$ at an energy of 30 keV. Accordingly, the high impurity concentration periphery N-type diffusion layer 14 is formed in the peripheral circuit region.

Figure 11:
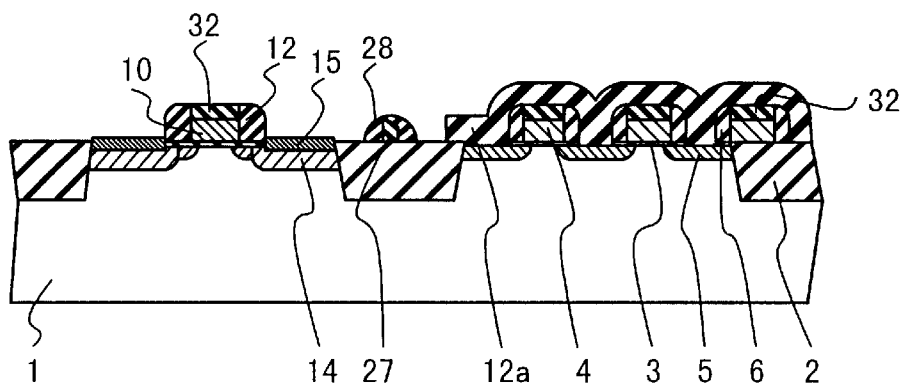
FIG. 11 is a section view showing still another process of manufacturing the semiconductor device shown in FIG. 6.

Next, in FIG. 11, after the removal of the resist 35, a titanium with a film thickness of 30 nm is deposited with the sputtering method. Then, the annealing is carried out in the atmosphere at 650° C. for one minute. Accordingly, the silicon in the exposed high impurity concentration periphery N-type diffusion layer 14 and the deposited titanium are made react to each other. The non-reacted titanium is removed with mixed solution of ammonium hydroxide and hydrogen peroxide water. Then, the annealing is carried out in the atmosphere at 800° C. for one minute to thereby form a titanium silicide 15 with a film thickness of 50 nm with high stability.

Figure 12:
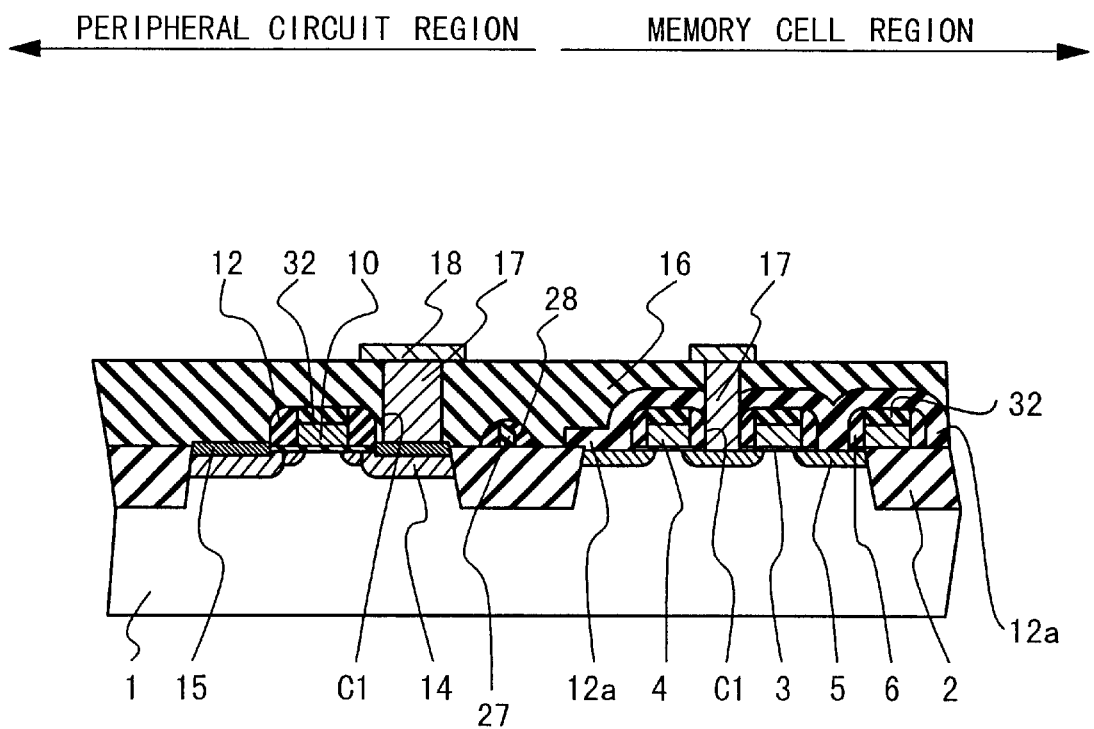
FIG. 12 is a section view showing still another process of manufacturing the semiconductor device shown in FIG. 6.

Next, in FIG. 12, the first interlayer dielectric film 16 is deposited on the surface in the memory cell region and the peripheral circuit region with the CVD method. The first interlayer dielectric film 16 is formed of a silicon oxide with a film thickness of 300 nm. Then, a contact hole C1 to the low impurity concentration cell N-type diffusion layer 5 or the titanium silicide layer 15 is opened in the first interlayer dielectric film 16. An N-type polysilicon film with a film thickness of 300 nm is deposited in this opened contact hole C1 with the CVD method.

Then, the etch-back of this deposited N-type polysilicon film enables the formation of the first contact plug 17 in which the N-type polysilicon film is buried in the contact hole C1. Then, the bit line 18 for covering the surface of the first contact plug 17 is formed on the surface of the first interlayer dielectric film 16. The bit line 18 is formed of a tungsten silicide with a film thickness of 100 nm.

Figure 13:
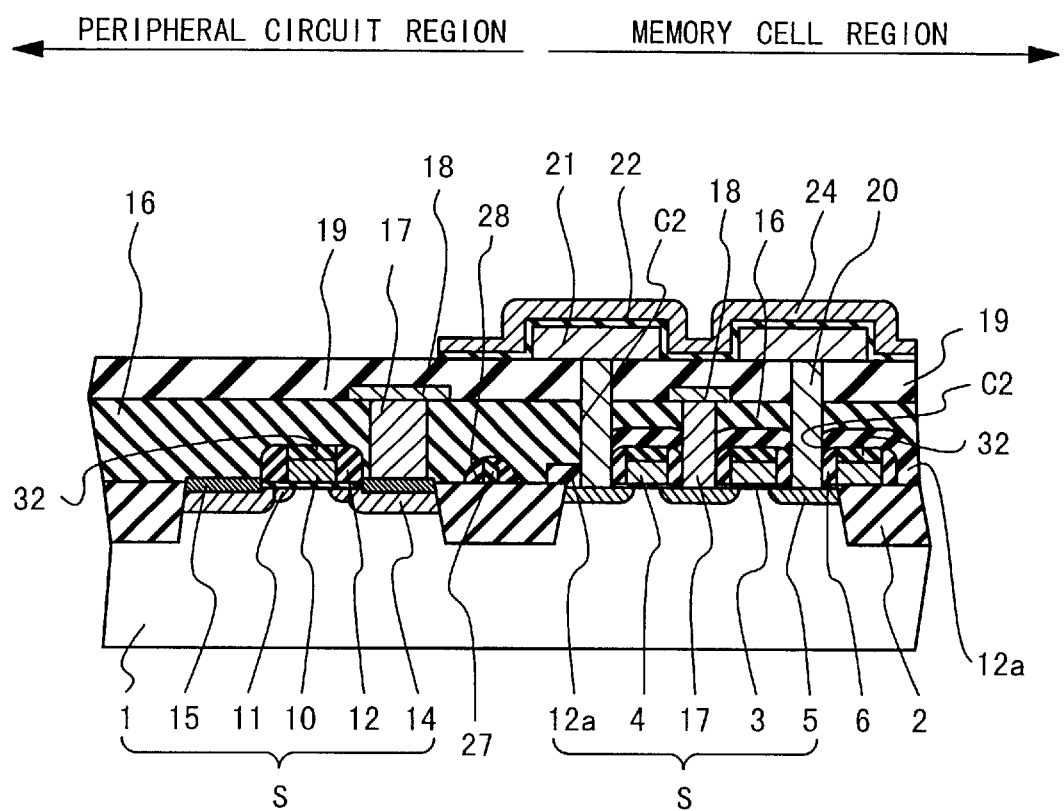
FIG. 13 is a section view showing still another process of manufacturing the semiconductor device shown in FIG. 6.

Next, In FIG. 13, the second interlayer dielectric film 19 is deposited on the surface of the first interlayer dielectric film 16. The second interlayer dielectric film 19 is formed with the CVD method and formed of a silicon oxide with a film thickness of 200 nm. Then, a contact hole C2 reaching the low impurity concentration cell N-type diffusion layer 5 is opened in the second interlayer dielectric film 19 and the first interlayer dielectric film 16 with the etching. The N-type polysilicon film with the film thickness of 300 nm is deposited on this opened contact hole C2 with the CVD method.

And, the etch-back of this N-type polysilicon film enables the formation of the second contact plug 20 in which the N-type polysilicon film is buried only in the contact hole C2. Next, the low portion electrode 21 of the capacitor is formed on the surface of the second interlayer dielectric film 19 such that the second contact plug 20 is covered. The low portion electrode 21 of the capacitor is formed of an N-type polysilicon with a film thickness of 500 nm.

And, the insulating film 22 of the capacitor is formed on the surface of the low portion electrode 21 of the capacitor. The insulating film 22 of the capacitor is formed of a silicon oxy-nitride with a equivalent film thickness of 5 nm in a case of converting into the silicon oxide film. Moreover, the upper portion electrode 24 of the capacitor is formed to cover the low portion electrode 21 of the capacitor through the insulating film 22 of the capacitor. The upper portion electrode 24 of the capacitor is deposited with the CVD method and is formed of an N-type polysilicon with a film thickness of 150 nm.

Figure 14:
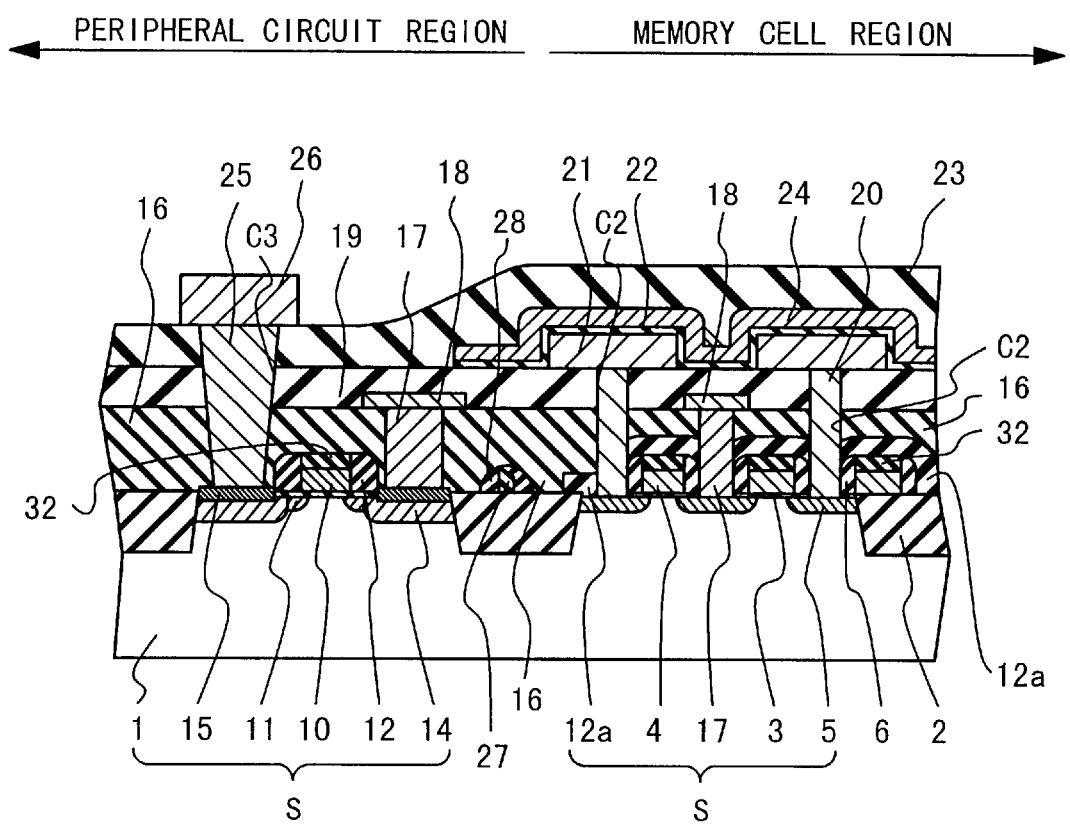
FIG. 14 is a section view showing still another process of manufacturing the semiconductor device shown in FIG. 6.

Next, in FIG. 14, a third interlayer dielectric film 23 is formed on the surfaces of the upper portion electrode 24 of the capacitor and the second interlayer dielectric film 19. The third interlayer dielectric film 23 is formed with the CVD method and formed of a silicon oxide with a film thickness of 200 nm. Then, the third contact hole C3 reaching the titanium silicide layer 15 is opened in the third interlayer dielectric film 23, the second interlayer dielectric film 19 and the first interlayer dielectric film 16.

Next, a titanium film and a titanium nitride film are deposited on the surface of the third interlayer dielectric film 23 and in the third contact hole C3 with the sputtering method. This titanium film has a film thickness of 50 nm. This titanium nitride film has a film thickness of 100 nm. In succession, a tungsten film with a film thickness of 400 nm is deposited on the surface of this titanium nitride film with the CVD method. Then, the etch-back of this tungsten film enables the formation of a third contact plug 25 in which tungsten and the like are buried only in the third contact hole C3.

Next, an aluminum alloy with a film thickness of 300 nm is deposited on the surface of the third interlayer dielectric film 23 to cover the surface of the third contact plug 25. Then, the aluminum alloy layer is removed with the etching such that the metal wiring 26 corresponding to the wiring portion of the aluminum alloy layer is left.

In this embodiment, the materials of the insulating film spacers formed on the side portion of the cell gate electrode and the side portion of the peripheral gate electrode are the silicon oxide and the silicon nitride, respectively. However, the present invention is not limited to the combination of these two kinds of silicon oxide film and silicon nitride film. So, it is possible to change the combination or change the materials.

Moreover, in this embodiment, the peripheral gate electrode is formed after the formation of the cell gate electrode. However, this order of the manufacturing process may be made converse.

As mentioned above, in this embodiment, the gate electrode in the memory cell region and the gate electrode in the peripheral circuit region are formed with the etching process in the separate lithography processes. As a result, the insulating film spacers formed of the different materials from each other can be formed on the side portions of the respective gate electrodes in the memory cell region and the peripheral circuit region, in self-alignment and in desirable order. Moreover, it is not necessary to remove the once-deposited insulating film serving as the spacer.

In addition, the resist 33 or 34 to form the gate electrode can be used as the mask in the ion implantation process of forming the diffusion layer serving as the source/drain.

The embodiment in the present invention has been detailed with reference to the drawings. However, the actual configuration is not limited to this embodiment. Configuration to which design modification and the like region applied in a range without departing from the spirit of the present invention is also included in the present invention.

Figure 15:
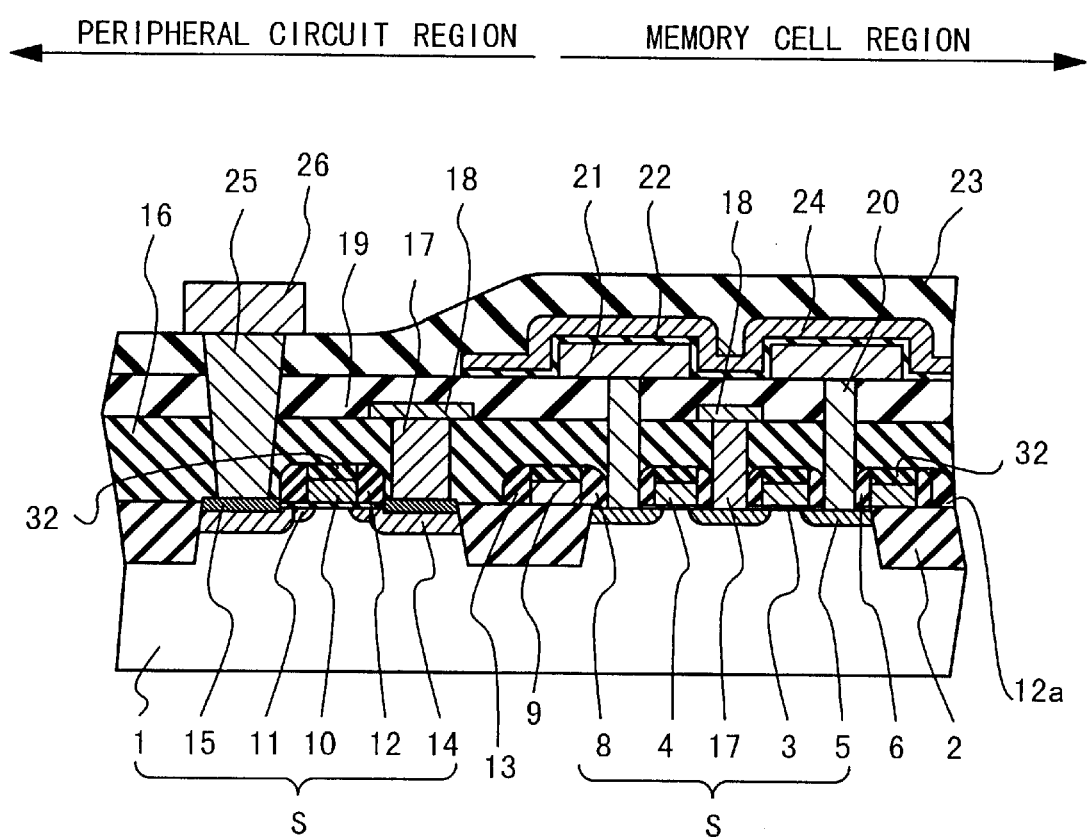
FIG. 15 is a section view showing a semiconductor device according to a second embodiment in the present invention.

For example, FIG. 15 is a section view showing the structure of a semiconductor device according to a second embodiment in the present invention. Mainly, points different from the first embodiment will be described below.

A dummy gate electrode 9 is formed on the surface of the element separation insulating film 2 in the boundary between the peripheral circuit region and the memory cell region. A dummy gate side silicon oxide film 8 is formed on a side portion on a side of the memory cell region of the dummy gate electrode 9. Moreover, a dummy gate side silicon nitride film 13 is formed on a side portion on a side of the memory peripheral circuit region of the dummy gate electrode 9.

FIGS. 16 to 23 are section views of sequentially showing a method of manufacturing the semiconductor device shown in FIG. 15 that is the second embodiment.

Figure 16:
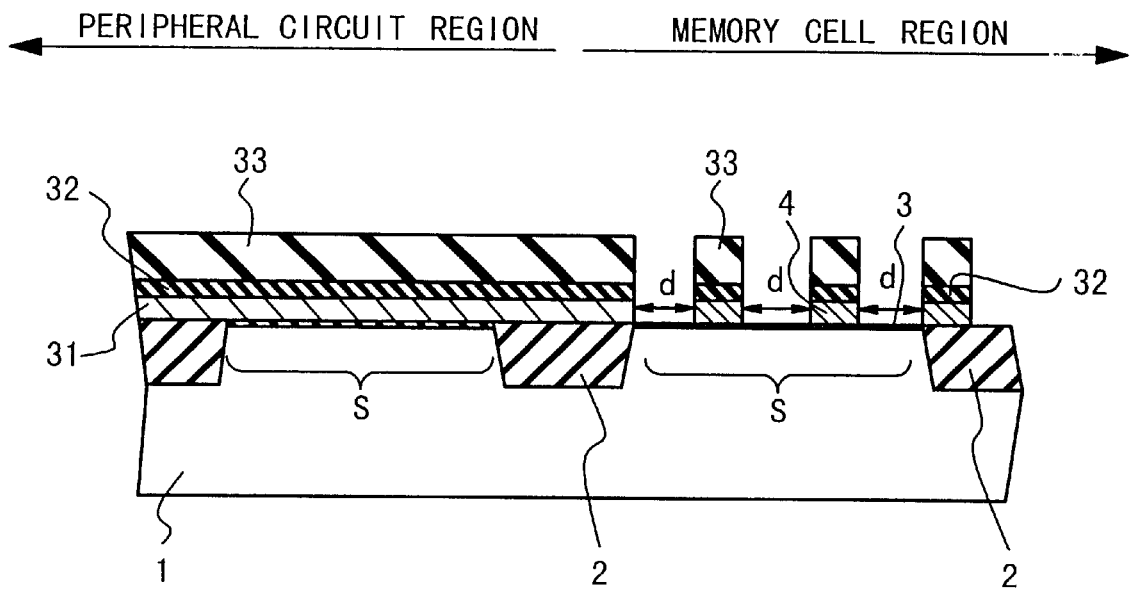
FIG. 16 is a section view showing a process of manufacturing the semiconductor device shown in FIG. 15.

In FIG. 16, an element separation insulating film 2 is formed on the surface of a P-type silicon substrate 1. The element region S is defined on the surface of the P-type silicon substrate 1 by the element separation insulating film 2. The element separation insulating film 2 has the trench isolation structure in which the silicon oxide film is buried in the groove formed on the surface of the P-type silicon substrate 1.

The gate oxide film 3 is formed on the surface of the P-type silicon substrate 1 in the element region S. The gate oxide film 3 is formed of a silicon oxide that has a film thickness of 8 nm and is formed with thermal oxidation. Next, a stacked film composed of a tungsten polycide film 31 and a first silicon nitride film 32 is formed on the gate oxide film 3. The tungsten polycide film 31 includes an N-type polysilicon film and a tungsten silicide film. The N-type polysilicon film has a film thickness of 100 nm and is deposited with the CVD method on the entire surface of the P-type silicon substrate 1. The tungsten silicide film has a film thickness of 150 nm and is deposited with the sputtering on the entire surface of the P-type silicon substrate 1. The first silicon nitride film 32 is deposited with the CVD method, and it has a film thickness of 200 nm.

Then, the first silicon nitride film 32 and the tungsten polycide film 31 are etched with a resist 33 formed by the lithography technique as a mask. Accordingly, a cell gate electrode 4 and a side portion on a side of a memory cell region of the dummy gate electrode 9 as mentioned later, are formed. At this time, the respective stacked films in the peripheral circuit region are left since the peripheral circuit region is entirely covered with the resist 33.

As shown in FIG. 16, a plurality of cell gate electrodes 4 are formed for each substantially equal interval d, in the memory cell region. The resist 33 is formed to cover the peripheral circuit region in a lateral direction to a position of the interval d from a cell gate electrode 4 (the leftmost cell gate electrode 4 in FIG. 16) located the closest to the peripheral circuit region of the plurality of cell gate electrodes 4. The resist 33 masks the peripheral circuit region and the element separation insulating film 2 provided between the peripheral circuit region and the memory cell region.

Figure 19:
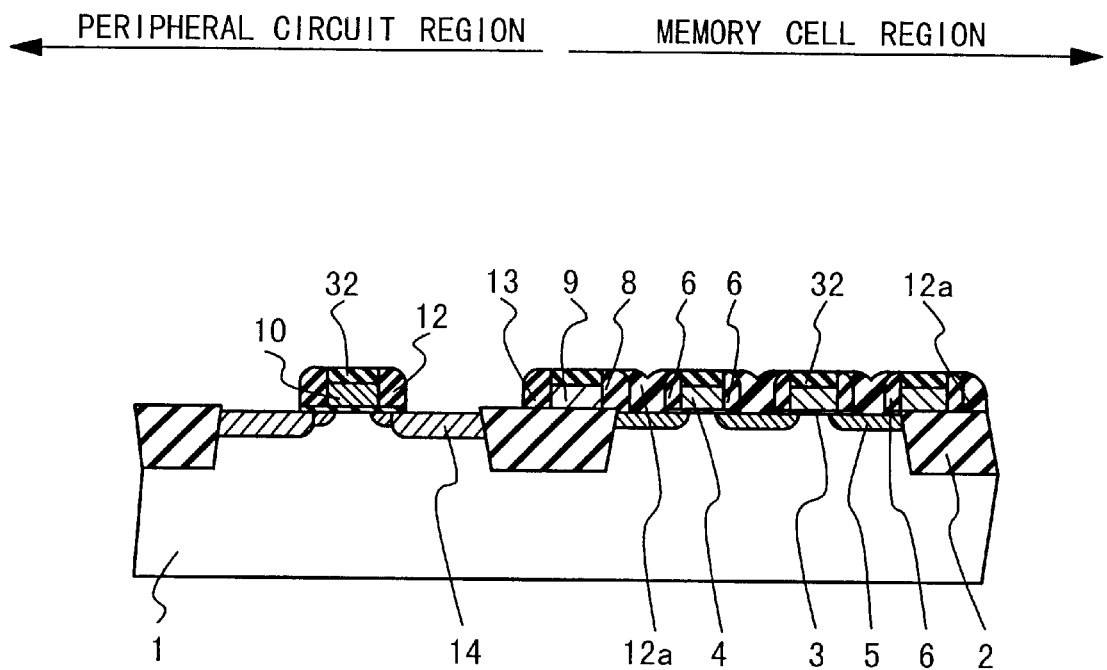
FIG. 19 is a section view showing still another process of manufacturing the semiconductor device shown in FIG. 15.

Referring to FIG. 19, this is because the dummy gate electrode 9 is provided at a position closer to the cell gate electrode 4, as mentioned later. Accordingly, the dummy electrode 9 can be formed such that the dummy electrode 9 covers the low impurity concentration cell N-type diffusion layer 5 in the memory cell region when the second silicon nitride film 12a is etched back without using a resist (corresponding to the resist 35 in the first embodiment).

Figure 17:
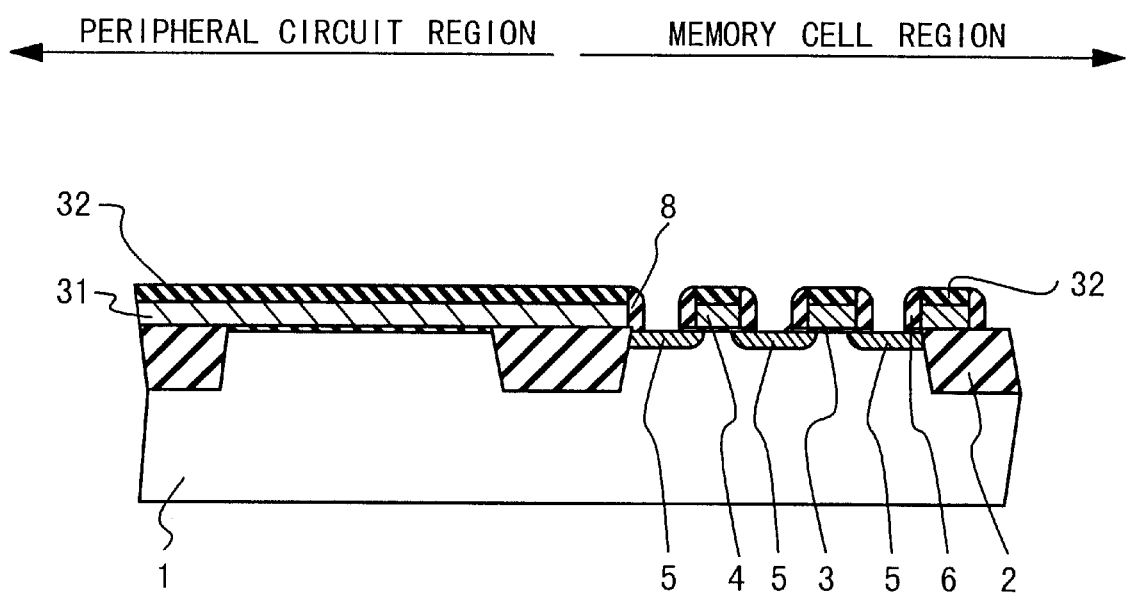
FIG. 17 is a section view showing another process of manufacturing the semiconductor device shown in FIG. 15.

Next, in FIG. 17, after the removal of the resist 33, the ion implantation is carried out with the stacked film of the first silicon nitride film 32 and the tungsten polycide film 31 as the mask, in the peripheral circuit region and the memory cell region. In this ion implantation, the ion is implanted at an implantation dose of $2E13cm^{-2}$ in an implantation energy of 15 keV. Accordingly, the low impurity concentration cell N-type diffusion layer 5 is formed in the memory cell region.

Then, a silicon oxide film with a film thickness of 50 nm is deposited with the CVD method. The deposited silicon oxide film is etched back to thereby form the cell gate side silicon oxide film 6 on the side portion of the gate electrode 4 of the memory cell transistor. Moreover, the dummy gate side silicon oxide film 8 is formed on the side portion on the side of the memory cell region of the dummy gate electrode 9, as mentioned later.

Figure 18:
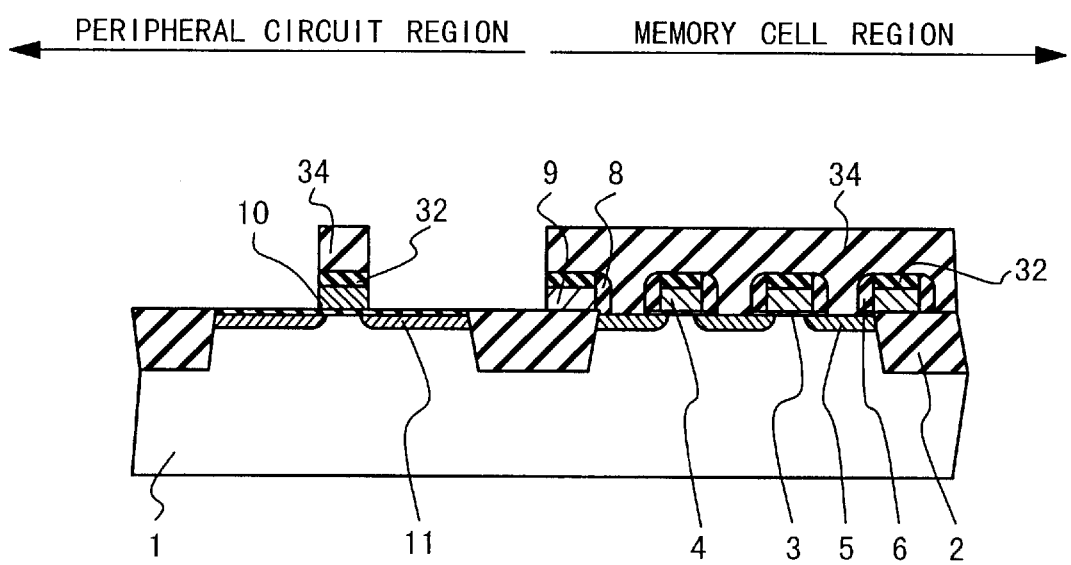
FIG. 18 is a section view showing still another process of manufacturing the semiconductor device shown in FIG. 15.

Next, in FIG. 18, the first silicon nitride film 32 and the tungsten polycide film 31 are etched with a resist 34 formed by the lithography technique as a mask. Accordingly, the gate electrode 10 of the transistor in the peripheral circuit region and the side portion on the side of the peripheral circuit region of the dummy gate electrode 9 are formed.

Then, the ion implantation is carried out with the resist 34 as a mask. In this ion implantation, an arsenic ion is implanted at an implantation dose of $1E13cm^{-2}$ in an implantation energy of 30 keV. Accordingly, the low impurity concentration periphery N-type diffusion layer 11 is formed in the peripheral circuit region.

Next, in FIG. 19, after the removal of the resist 34, a second silicon nitride film 12a with a film thickness of 150 nm is deposited with the CVD method, in the peripheral circuit region and the memory cell region. Then, the peripheral gate side silicon nitride film 12 is formed on the side portion of the peripheral gate electrode 10 by etching back the second silicon nitride film 12a. Moreover, the dummy gate side silicon nitride film 13 is formed on the side portion on the side of the peripheral circuit region of the dummy gate electrode 9.

At this time, the entire surface of the second silicon nitride film 12a is etched back without using the lithography process, when the peripheral gate side silicon nitride film 12 is formed. That is, the entire surface of the second silicon nitride film 12a is etched back without using a resist corresponding to the resist 35 in the first embodiment as the mask. Accordingly, the portion corresponding to the interval d between the gate electrodes 4 in the memory cell region (refer to FIG. 16) is filled with the silicon nitride film since the interval d is narrow.

By using the ion implantation, the arsenic is implanted by $3E15cm^{-2}$ at the energy of 30 keV. Accordingly, the high impurity concentration periphery N-type diffusion layer 14 is formed in the peripheral circuit region. There is the dummy gate electrode 9 in the outermost side portion of the memory cell region. Thus, the low impurity concentration cell N-type diffusion layer 5 is never exposed differently from the low impurity concentration periphery N-type diffusion layer 11. Hence, the low impurity concentration cell N-type diffusion layer 5 is never formed to be the high concentration layer.

Figure 20:
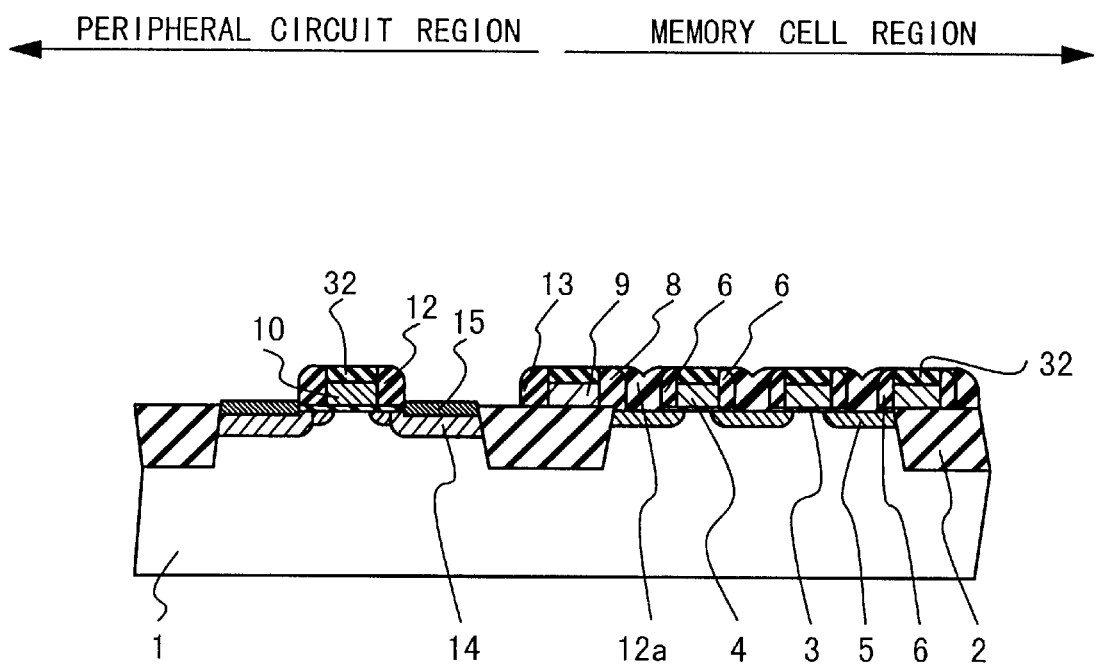
FIG. 20 is a section view showing still another process of manufacturing the semiconductor device shown in FIG. 15.

Next, in FIG. 20, a titanium with a film thickness of 30 nm is deposited with the sputtering method. Then, the annealing is carried out in the atmosphere at 650° C. for one minute. Accordingly, the silicon in the exposed high impurity concentration periphery N-type diffusion layer 14 and the deposited titanium are made react to each other. The non-reacted titanium is removed with the mixed solution of ammonium hydroxide and hydrogen peroxide water. Then, the annealing is carried out in the atmosphere at 800° C. for one minute to thereby form a titanium silicide 15 with a film thickness of 50 nm with high stability.

Figure 21:
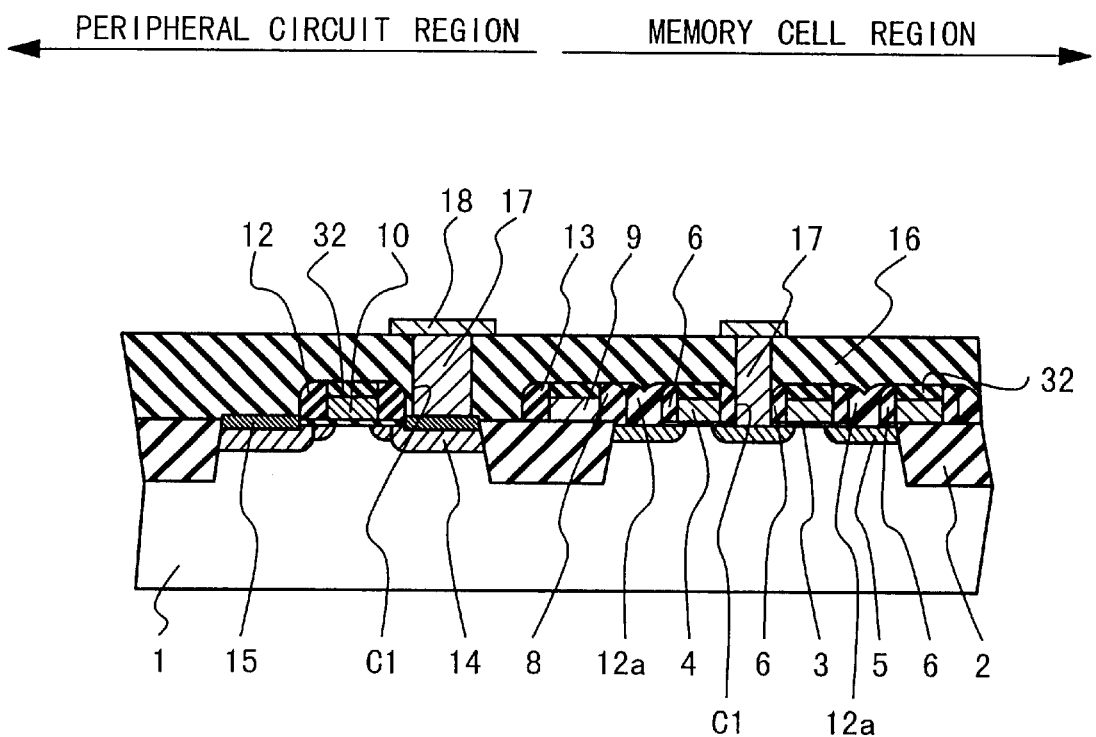
FIG. 21 is a section view showing still another process of manufacturing the semiconductor device shown in FIG. 15.

Next, in FIG. 21, the first interlayer dielectric film 16 is deposited on the surface in the memory cell region and the peripheral circuit region with the CVD method. The first interlayer dielectric film 16 is formed of a silicon oxide with a film thickness of 300 nm. Then, a contact hole C1 to the low impurity concentration cell N-type diffusion layer 5 or the titanium silicide layer 15 is opened in the first interlayer dielectric film 16. An N-type polysilicon film with a film thickness of 300 nm is deposited in this opened contact hole C1 with the CVD method.

Then, the etch-back of this deposited N-type polysilicon film enables the formation of a first contact plug 17 in which the N-type polysilicon film is buried in the contact hole C1. Next, a bit line 18 for covering the surface of the first contact plug 17 is formed on the surface of the first interlayer dielectric film 16. The bit line 18 is formed of a tungsten silicide with a film thickness of 100 nm.

Figure 22:
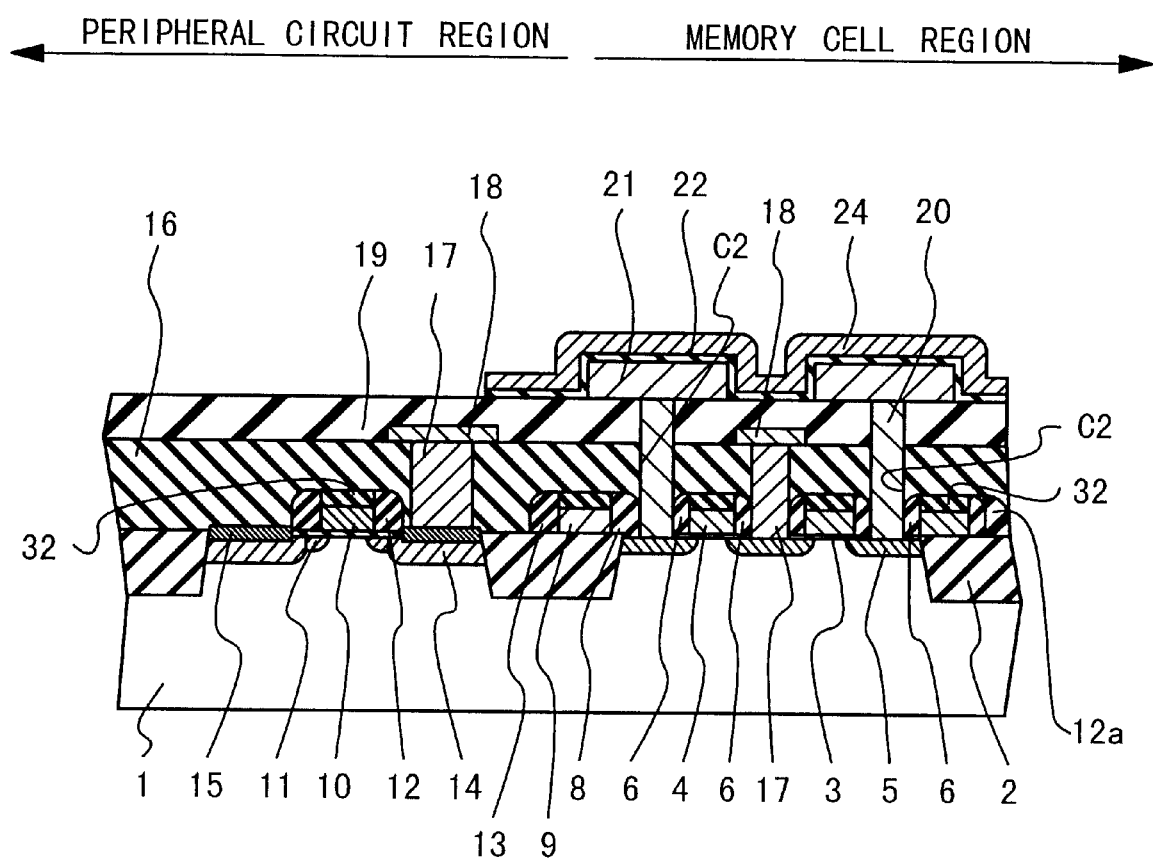
FIG. 22 is a section view showing still another process of manufacturing the semiconductor device shown in FIG. 15.

Next, In FIG. 22, the second interlayer dielectric film 19 is deposited on the surface of the first interlayer dielectric film 16. The second interlayer dielectric film 19 is formed with the CVD method and formed of a silicon oxide with a film thickness of 200 nm. Then, a contact hole C2 reaching the low impurity concentration cell N-type diffusion layer 5 is opened in the second interlayer dielectric film 19 and the first interlayer dielectric film 16 with the etching. The N-type polysilicon film with the film thickness of 300 nm is deposited in this opened contact hole C2 with the CVD method.

And, the etch-back of this N-type polysilicon film enables the formation of a second contact plug 20 in which the N-type polysilicon film is buried only in the contact hole C2. Next, a low portion electrode 21 of a capacitor is formed on the surface of the second interlayer dielectric film 19 such that the second contact plug 20 is covered. The low portion electrode 21 of the capacitor is formed of an N-type polysilicon with a film thickness of 500 nm.

And, a insulating film 22 of the capacitor is formed on the surface of this low portion electrode 21 of the capacitor. The insulating film 22 of the capacitor is formed of a silicon oxy-nitride with a equivalent film thickness of 5 nm in a case of converting into the silicon oxide film. Moreover, a upper portion electrode 24 of the capacitor is formed to cover the low portion electrode 21 of the capacitor through the insulating film 22 of the capacitor. The upper portion electrode 24 of the capacitor is deposited with the CVD method and is formed of an N-type polysilicon with a film thickness of 150 nm.

Figure 23:
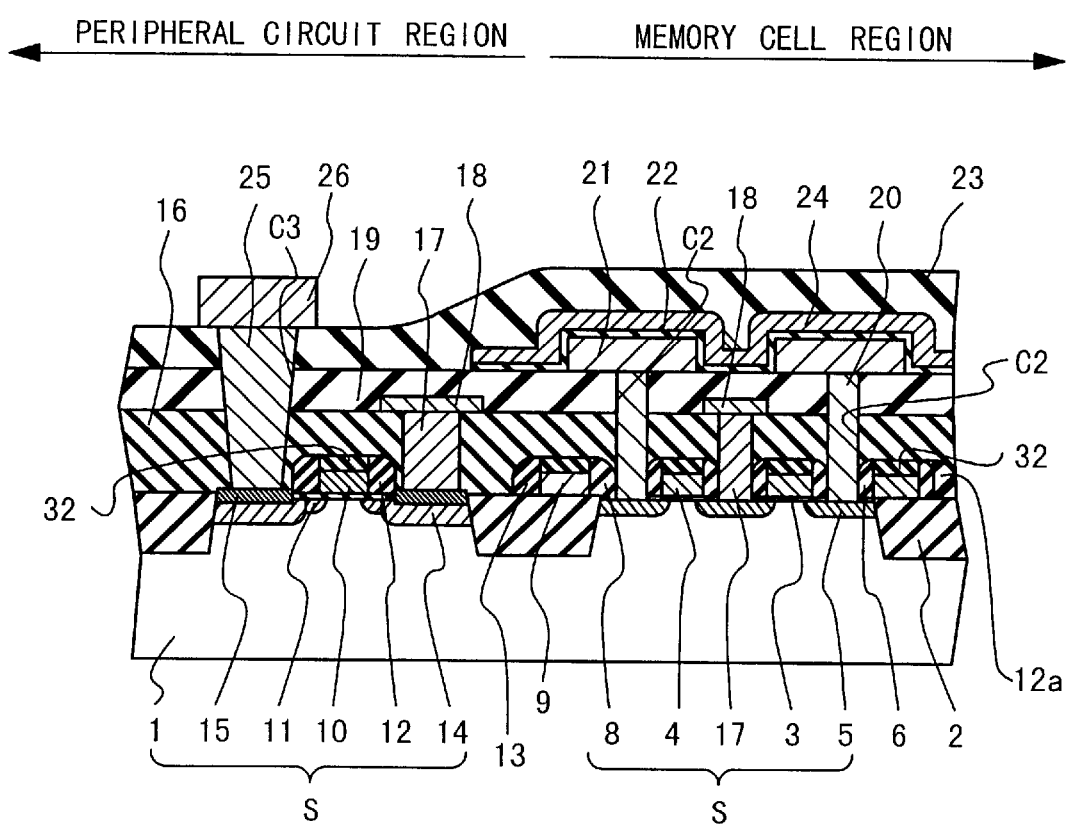
FIG. 23 is a section view showing still another process of manufacturing the semiconductor device shown in FIG. 15.

Next, in FIG. 23, a third interlayer dielectric film 23 is formed on the surfaces of the upper portion electrode 24 of the capacitor and the second interlayer dielectric film 19. The third interlayer dielectric film 23 is formed with the CVD method and formed of a silicon oxide with a film thickness of 200 nm. Then, a third contact holes C3 reaching the titanium silicide layer 15 are opened in the third interlayer dielectric film 23, the second interlayer dielectric film 19 and the first interlayer dielectric film 16.

Next, a titanium film and a titanium nitride film are deposited on the surface of the third interlayer dielectric film 23 with the sputtering method. This titanium film has a film thickness of 50 nm. This titanium nitride film has a film thickness of 100 nm. In succession, a tungsten film with a film thickness of 400 nm is deposited on the surface of this titanium nitride film with the CVD method. Then, the etch-back of this tungsten film enables the formation of a third contact plug 25 in which the tungsten and the like are buried only in the third contact hole C3.

Next, an aluminum alloy with a film thickness of 300 nm is deposited on the surface of the third interlayer dielectric film 23 to cover the surface of the third contact plug 25. Then, the aluminum alloy layer is removed with the etching such that the metal wiring 26 corresponding to the wiring portion of the aluminum alloy layer is left.

In this embodiment, the materials of the insulating film spacers formed on the side portion of the cell gate electrode and the side portion of the peripheral gate electrode are the silicon oxide and the silicon nitride, respectively. However, the present invention is not limited to the combination of these two kinds of silicon oxide film and silicon nitride film. So, it is possible to change the combination or change the materials.

Moreover, as mentioned above, in the second embodiment, it is not necessary to form the resist corresponding to the resist 35 in the first embodiment. As a result, it is possible to simplify the process of manufacturing the semiconductor device.

The present invention has: a semiconductor substrate, a first insulating film spacer formed on a side portion of a gate electrode of a first MOS transistor formed in a first semiconductor element region on a surface of the semiconductor substrate, and a second insulating film spacer formed on a side portion of a gate electrode of a second MOS transistor formed in a second semiconductor element region separated by an insulating film pattern with the first semiconductor element region on the surface of the semiconductor substrate, wherein the materials of the first insulating film spacer and the second insulating film spacer are different from each other. Thus, for example, the side portion of the gate electrode of MOSFET of a memory cell that is the first MOS transistor can be covered with the first insulating film spacer formed of the silicon oxide. Hence, the hot carrier resistance of the MOSFET can be improved. Moreover, when silicide is formed in self-alignment on the surface of a diffusion layer serving as a source/drain of the second MOS transistor used in a peripheral circuit, silicon nitride film can be used as the second insulating film spacer for protecting the gate electrode. Accordingly, the silicide can be formed on the surface of the diffusion layer in the self-alignment with high reliability and excellent reproducibility.

The present invention includes: forming a first semiconductor element region and a second semiconductor element region separated by an insulating film pattern formed on a surface of a semiconductor substrate, forming a first MOS transistor in the first semiconductor element region, forming a first insulating film spacer on a side portion of a gate electrode of the first MOS transistor, forming a second MOS transistor in the second semiconductor element region, and forming a second insulating film spacer whose material is different from that of the first insulating film spacer on a side portion of a gate electrode of the second MOS transistor. Thus, for example, the side portion of the gate electrode of MOSFET of a memory cell that is the first MOS transistor can be covered with the first insulating film spacer formed of the silicon oxide. Hence, the hot carrier resistance of the MOSFET can be improved. Moreover, when silicide is formed in self-alignment on the surface of a diffusion layer serving as a source/drain of the second MOS transistor used in a peripheral circuit, silicon nitride film can be used as the second insulating film spacer for protecting the gate electrode. Accordingly, the silicide can be formed on the surface of the diffusion layer in the self-alignment with high reliability and excellent reproducibility.

The present invention includes a dummy gate electrode with a gate electrode structure of a MOS transistor, in which between the first semiconductor element region and the second semiconductor element region, the first insulating film spacer is formed on the side portion on a side of this first semiconductor element region thereof, and the second insulating film spacer is formed on the side portion on a side of this second semiconductor element region thereof. Thus there is no exposure of the source or the drain formed with the low impurity concentration of the MOSFET of the memory cell for example, that is the first MOS transistor. Hence, the silicide layer can be formed in the source/drain of a peripheral transistor without a mask.

According to the present invention, the dummy gate electrode is formed by overlapping a first mask to form the gate electrode of the first transistor and a second mask to form the gate electrode of the second transistor to each other. Thus, two kinds of insulating film materials can be used on the side portions of the gate electrode without increasing the lithography process in the manufacturing process. Hence, the cost increase can be held down.

What is claimed:

1. A method of manufacturing a semiconductor device, comprising the steps of:
    (a) providing a semiconductor substrate having first and second semiconductor element formation regions;
    (b) forming a plurality of first gate electrodes of first MOS transistors in said first semiconductor element formation region in a state that said second semiconductor element formation region is masked;
    (c) forming first source/drain regions of said first MOS transistors in said first semiconductor element formation region in the state that said second semiconductor element formation region is masked;
    (d) forming first side wall insulating film spacers on side portions of said first gate electrodes in the state that said second semiconductor element formation region is masked;
    (e) forming a second gate electrode of a second MOS transistor in said second semiconductor element formation region in a state that said second semiconductor element formation region is masked;
    (f) forming a second insulating film on an entire surface of said substrate;
    (g) etching back the entire surface of the second insulating film to form second side wall insulating film spacers on side portions of said second gate electrode, while leaving unetched the second insulating film on said first source/drain regions;
    (h) forming second source/drain regions of said second MOS transistor in said second semiconductor formation region in the state that said first semiconductor element formation region is masked; and
    (i) selectively forming a silicide layer on said second source/drain regions, wherein said first source/drain regions are masked with said leaving portions of said second insulating film.

2. The method of claim 1, wherein said first and second side wall insulating film spacers are formed of materials different from each other.

3. The method of claim 1, wherein said first side wall insulating film spacers are formed of silicon oxide.

4. The method of claim 1, wherein said second side wall insulating film spacers are formed of silicon nitride.

5. The method of claim 1, wherein said first MOS transistors are transistors of memory cells of a DRAM, and said second MOS transistor is a transistor of a logic integrated circuit.

6. The method of claim 1, wherein an impurity concentration of said first source/drain regions is lower than an impurity concentration of said second source/drain regions.

7. The method of claim 1, further comprising the step of forming a dummy gate electrode on an element separation insulating film in the boundary between said first and second semiconductor element formation regions for masking a first source/drain region between said first gate electrode and said dummy gate electrode with said leaving portion of said second insulating film when said silicide layer is formed.

* * * * *